United States Patent [19]

Bernstein

[11] Patent Number: 5,642,047
[45] Date of Patent: Jun. 24, 1997

[54] METHOD FOR CORRECTING MR PHASE INFORMATION IMAGE DATA

[75] Inventor: Matthew A. Bernstein, Waukesha, Wis.

[73] Assignee: General Electric Company, Milwaukee, Wis.

[21] Appl. No.: 569,617

[22] Filed: Dec. 8, 1995

[51] Int. Cl.⁶ ................................................ G01R 33/20
[52] U.S. Cl. .................................................... 324/309
[58] Field of Search ...................... 324/300, 307, 324/309, 306, 312, 314, 320, 318, 322; 128/653.2, 653.3

[56] References Cited

U.S. PATENT DOCUMENTS

| | | | |
|---|---|---|---|
| 4,591,789 | 5/1986 | Glover et al. | 324/307 |
| 5,498,963 | 3/1996 | Schneider et al. | 324/309 |

OTHER PUBLICATIONS

Bernstein and Frigo, "Gradient Non–Linearity Correction for Phase Difference Images", Proceedingsof the SMR and Eur. Soc. for Mag. Res. in Med. & Biol., vol. 2, p. 739, Aug., 1995, Nice, France.

*Primary Examiner*—Sandra L. O'Shea
*Assistant Examiner*—Raymond Y. Mah
*Attorney, Agent, or Firm*—James O. Skarsten; John H. Pilarski

[57] ABSTRACT

A method for correcting MR data elements acquired in the presence of an imperfectly linear gradient field, each element comprising nominal first and second quadrature components. The quadrature components are multiplied by an artifact correction factor to provide respective first and second quantities. A Gradwarp geometric correction operation is applied to respective quantities to provide a corrected first and second quadrature component, corresponding to each data element. For a given data element, the arctangent function is applied to the result obtained by dividing the first corrected component by the second corrected component to provide a corrected phase component for use in forming an image.

12 Claims, 2 Drawing Sheets

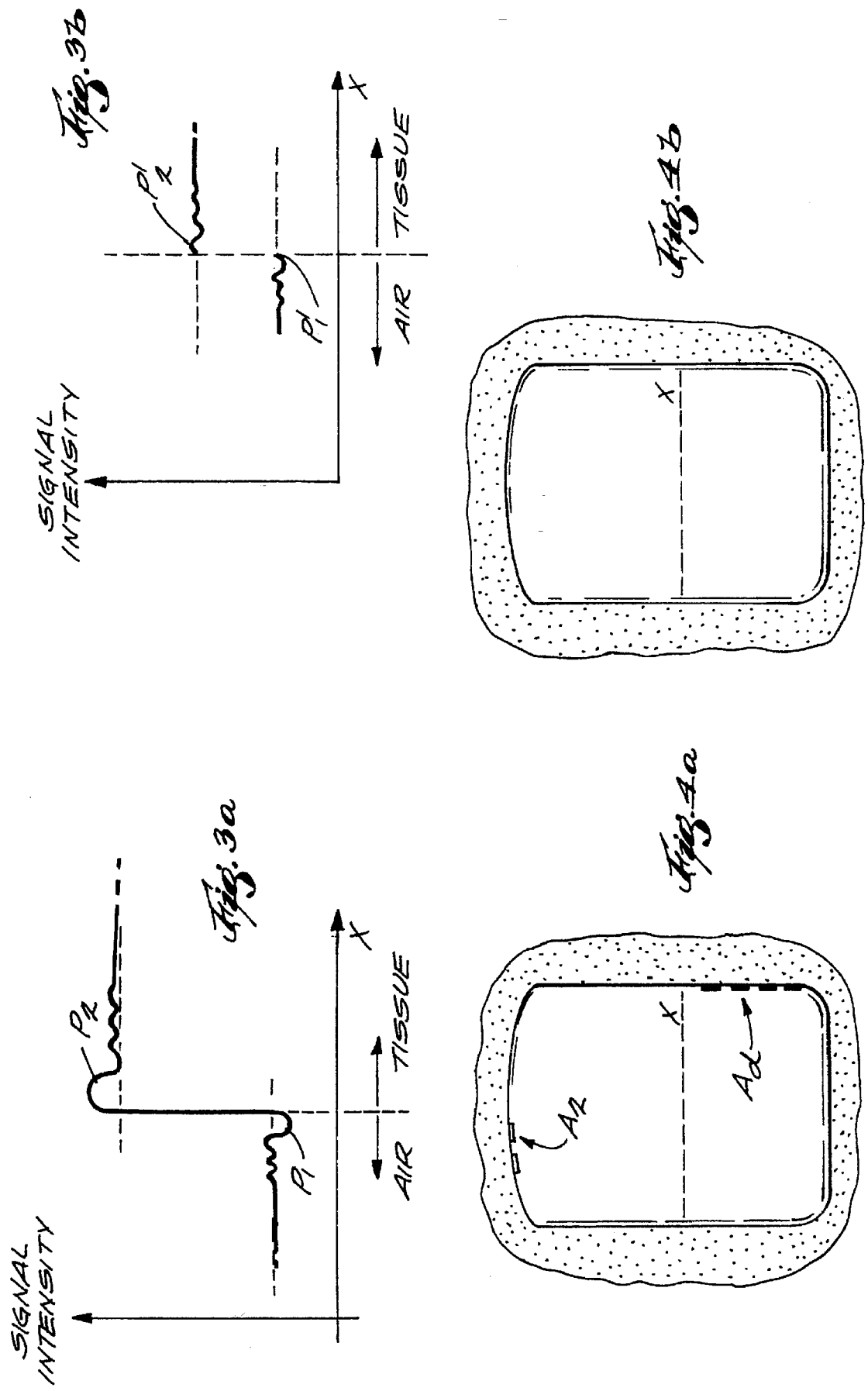

METHOD FOR CORRECTING MR PHASE INFORMATION IMAGE DATA

BACKGROUND OF THE INVENTION

The invention disclosed and claimed herein generally pertains to phase and phase difference magnetic resonance (MR) imaging. More particularly, the invention pertains to a method for correcting the effect of distortion in a set of MR data to be used in phase or phase difference imaging, wherein the distortion results from non-linearity in one or more gradient magnetic fields used in acquiring the data.

As is well known, acquired MR imaging data can be represented in quadrature. That is, the MR signal at each pixel location can be represented by two complex components which are 90 degrees out of phase, commonly referred to as the I and Q components, respectively. Thus, the MR signal at each pixel location has a magnitude equal to $\sqrt{(I^2+Q^2)}$, and a phase component equal to the arctangent of (Q/I), or $\tan^{-1}$ (Q/I).

In the past, it has been most common to employ signal magnitude in forming MR images. However, it is now recognized that for certain applications, such as imaging of flowing fluids (such as blood or cerebral spinal fluid) and shimming, there are distinct benefits in using the phase component at respective pixel locations to form MR phase and phase difference images. As is known by those of skill in the art, a phase difference image can be constructed by first obtaining two phase images of a subject. An imaging parameter is varied between the two phase images, so that the respective phases thereof are different. For example, in phase contrast angiography, also known as phase mapping, wherein flow velocity along an axis is to be measured, the value of the first gradient moment along the axis is varied to produce two different data sets. One of the phase images is then subtracted from the other, on a pixel-by-pixel basis, to provide the phase difference image. Thus, given two phase images $\phi_A=\tan^{-1}(Q_A/I_A)$ and $\phi_B=\tan^{-1}(Q_B/I_B)$, the phase difference $\Delta\phi$ may be obtained from subtraction, i.e., $\Delta\phi=\phi_B-\phi_A$. As known to those skilled in the art, the phase difference is more commonly calculated with a single arctangent via the expression:

$$\Delta\phi=\tan^{-1}\{(I_AQ_B-I_BQ_A)/(I_AI_B+Q_BQ_A)\} \quad \text{Equation 1}$$

The single arctangent function ensures $\Delta\phi$ in Equation 1 covers a range of $2\pi$ radians or 360 degrees. The invention herein and the teachings set forth with respect thereto are considered to apply to both phase images and phase difference images. Hereinafter, the term "phase information image" is used to refer to both phase and phase difference images.

As is further well known, a set of MR image data may be acquired under conditions wherein the X-, Y- and/or Z-gradient magnetic fields are non-linear relative to their respective axes, across at least a portion of the field of view. Imperfect linearity, or nonuniformity, of the gradient, which results in image distortion, is of particular concern if the field of view is comparatively large, which often is the case, for example, for imaging the spine in the sagittal plane. Accordingly, techniques have been developed to geometrically correct an image for the distorting effects of gradient nonuniformity, as exemplified by commonly assigned U.S. Pat. No. 4,591,789, issued May 27, 1986 to Glover and Pelc. Such patent is directed to a technique hereinafter referred to as "Gradwarp".

The Gradwarp technique applies a two step process to a set of MR data elements, wherein the elements comprise nominal values of an MR signal parameter at respective locations in a set of pixel locations. In accordance with the first step, a magnification/minification, pixel displacement or warp factor, which is determined by the gradient nonuniformity, is applied to displace or remap respective data elements to their actual locations. In the second step, an interpolation is performed, using the displaced data elements, to determine the actual or corrected values of the MR signal parameter at respective pixel locations. The interpolation step commonly uses polynomial interpolation, such as a cubic or quartic function, such as fitting a cubic spline curve through four displaced data elements close to a pixel location, and then sampling the curve at the pixel location.

Techniques such as Gradwarp have generally been quite effective in correcting distortion of the above type in images constructed from MR signal magnitudes. However, if the Gradwarp technique is applied to the respective phase values of a phase image, the corrected phase image, or phase map, will not be unwrap-compatible. Unwrap-compatibility is discussed in more detail hereinafter, in connection with FIG. 2 of the drawings. In addition, overshoot and ringing, also described hereinafter, can occur in applying the interpolation step to compute corrected phase values at pixel locations which are close to a boundary or interface between materials of very different MR properties, such as body tissue and air. Overshoot causes artifacts in the form of bright and dark spots which lie along the boundary.

SUMMARY OF THE INVENTION

A method is provided for correcting MR data, acquired for use in forming a phase information image, for the effects of an associated imperfectly linear gradient magnetic field. The method includes the step of reconstructing MR image elements from data acquired in the presence of the imperfectly linear gradient field, each of the image elements comprising first and second quadrature components corresponding to a pixel location in a set of pixel locations. The quadrature components corresponding to a pixel location are multiplied by an artifact correction factor, likewise corresponding to the pixel location, to provide respective first and second quantities. A geometric correction (Gradwarp) having a specified relationship to gradient non-linearity is applied to each of the first and second quantities to provide respective corrected first and second components, one of the corrected first components and one of the corrected second components corresponding to each of the pixel locations. For a given pixel location, the arctangent function is applied to the result obtained by dividing the first corrected component corresponding thereto by the second corrected component corresponding thereto, to provide a corrected phase component for use in forming a phase information image.

In a preferred embodiment, the artifact correction factor has the form $M^n$, where, for a particular pixel location, M is the square root of the sum of the squares of the nominal first and second quadrature components respectively corresponding to the particular location. Preferably, n is on the order of −0.5.

Preferably also, the geometric correction step comprises displacing respective first and second quadrature components to their respective actual locations, and then employing displaced first quadrature components in performing interpolations to provide the corrected first components, and likewise employing displaced second quadrature components in performing interpolations to provide the corrected second components.

OBJECTS OF THE INVENTION

An object of the invention is to provide an improved method for correcting geometric distortion, resulting from gradient field non-linearity, in MR phase and phase difference imaging.

Another object is to provide a method of the above type which does not introduce other distortions or artifacts, such as those resulting from flawed unwrapping, or overshoot associated with Gradwarp interpolation.

Another object is to provide an improved method of the above type for angiography and shimming applications.

Another object is to provide a method of the above type for use in phase mapping or phase contrast imaging to image flow of blood or cerebral spinal fluid.

These and other objects of the invention will become more readily apparent from the ensuing specification, taken together with the accompanying drawings.

BRIEF DESCRIPTION OF THE DRAWINGS

FIGS. 3a and 3b are a set of graphs respectively illustrating overshoot, and the substantial reduction in overshoot achieved by an embodiment of the invention.

FIGS. 4a and 4b show a schematic set of images respectively depicting the overshoot artifact, and the correction thereof achieved by an embodiment of the invention.

DETAILED DESCRIPTION OF THE PREFERRED EMBODIMENT

Figure 1:
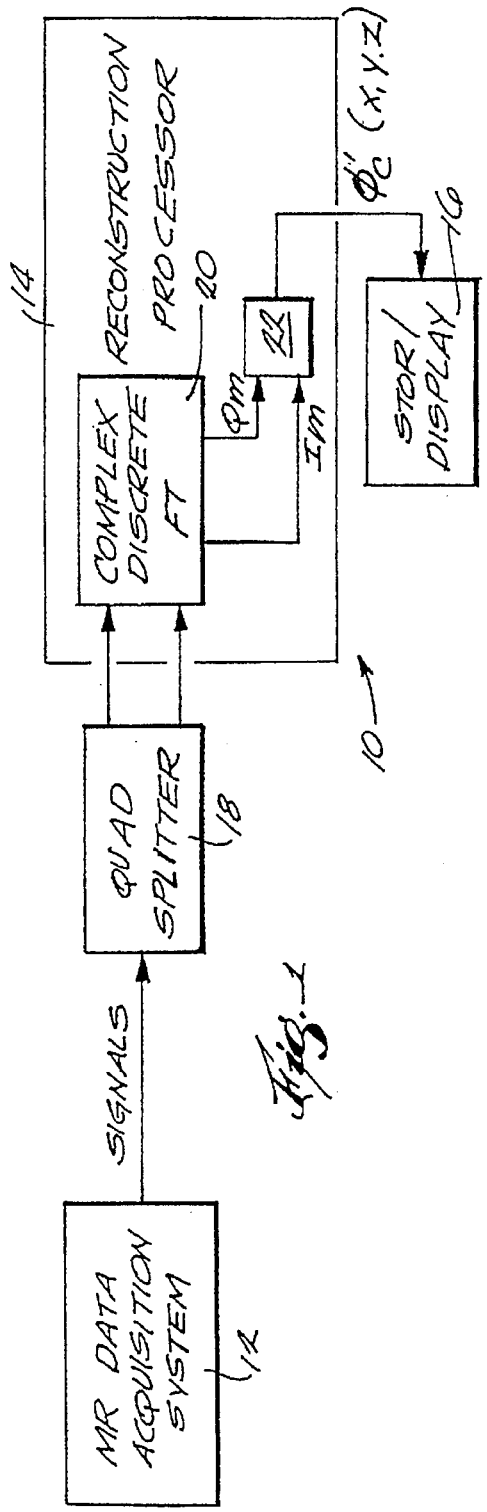
FIG. 1 is a simplified block diagram showing structure for implementing an embodiment of the invention.

Referring to FIG. 1, there is shown an MR imaging system 10 which, for purposes of emphasizing the invention, is shown to comprise a data acquisition system 12, reconstruction processor 14 and a data storage or display device 16. As is very well known, data acquisition system 12 generally comprises a configuration of gradient coils, main magnet and RF transmit and receive coils (not shown), together with components for driving the coils in accordance with specified imaging waveforms. Magnetic fields respectively generated by the driven coils relative to a subject of imaging (not shown) enable the receive coil to acquire a set of MR data for constructing an image of a section taken through the subject. The data set comprises the MR signals S. As stated above, the acquired MR data is commonly represented in the form of two quadrature components. This may be accomplished with a device 18 known as a quadrature splitter, coupled between acquisition system 12 and processor 14. The quadrature data are then reconstructed into a complex image with a complex Fourier transform. The Fourier transformation on the data provides the resultant complex image with I and Q channels, there being a 90 degree phase shift therebetween. The Fourier transform operation is carried out by processor 14, and is represented therein as a block 20. Thus, data for each pixel in the form of quadrature components $I_m(x, y, z)$ and $Q_m(x, y, z)$ are provided for further use by processor 14.

As also stated above, the phase value $\phi_m$ for the pixel $(x_0, Y_0, z_0)$ can be found from the relation $\phi_m = \tan^{-1}[Q_m(x_0, y_0, z_0)/I_m(x_0, y_0, z_0)]$. However, in the event of, for example, X-gradient non-linearity, the values of $Q_m(x_0, y_0, z_0)$ and $I_m(x_0, y_0, z_0)$ would only be nominal with regard to pixel location $(x_0, y_0, z_0)$, in that the MR signal represented thereby would have actually been acquired, for example, at a position $(x_1, y_0, z_0)$. Accordingly, an image formed from respective phase values $\phi_m$ would be geometrically distorted.

The reconstruction processor 14 could generate phase values $\phi_m$ directly from $I_m$ and $Q_m$. The Gradwarp technique described above could then be applied directly to respective phase values $\phi_m$. However, it has been found that an image formed of phase data constructed thereby would not be unwrap compatible.

Figure 2B:
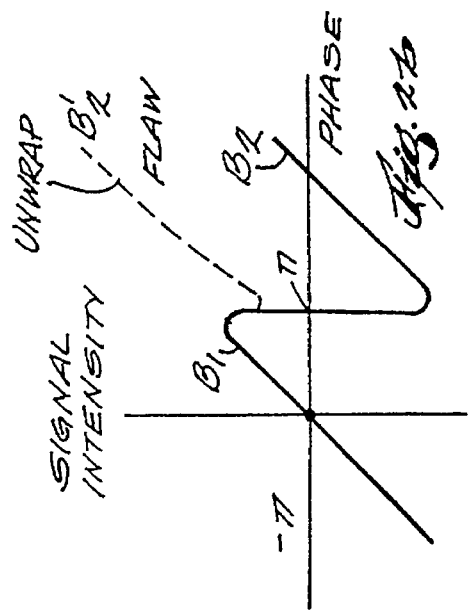
FIGS. 2a and 2b are a set of curves respectively illustrating seamless and flawed unwrapping.
Figure 2A:
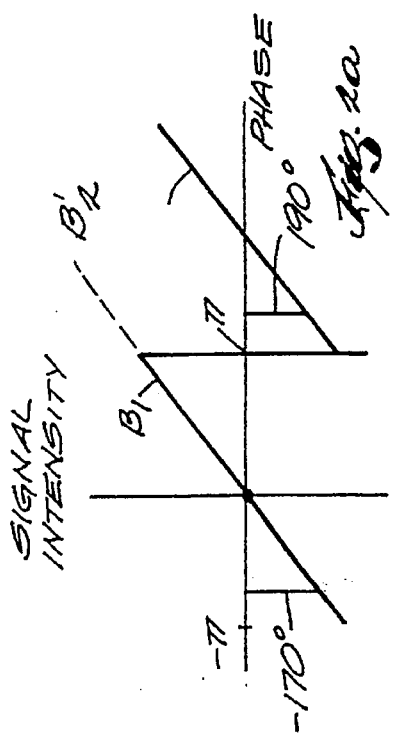

To illustrate unwrap compatibility, reference is made to FIG. 2(a), which shows a plot of signal intensity versus phase. The discussion which follows in connection with FIG. 2 assumes that the expression in Equation 1, above, or one which is mathematically equivalent thereto, was used. It will be readily apparent that all phase values derived with the arctangent function are limited to a range of $2\pi$ radians, such as $-\pi$ to $\pi$ (or $-180$ degrees to 180 degrees). However, it is frequently desirable to go beyond such limits, in order to extend the range over which signal intensity is linearly proportional to phase. This is accomplished by a technique known in the art as unwrapping or phase unwrapping. In accordance with such technique, the signal-phase curve of FIG. 2(a) includes a first branch B1 extending between $-\pi$ and $\pi$, and a second branch B2 extending between $\pi$ and $3\pi$, both branches depicting linear relationships between signal intensity or contrast and $\phi$. A phase value which exceeds $\pi$ or 180 degrees by the amount $\delta$, such as a $\delta$ of 10 degrees so that phase is 190 degrees, is represented as a phase of $-180$ degrees $+\delta$, i.e., $-170$ degrees. Accordingly, as $\phi$ increases to 190 degrees, the signal intensity jumps to branch B2. The signal intensity value on branch B2 corresponding to 190 degrees is the same as the signal intensity value on branch B1 corresponding to a phase of $-170$ degrees. Thus, branch B2 extends the phase range by $2\pi$. For FIG. 2(a), branch B2 could be displaced upwardly to align with linear branch B1, as shown by dotted line B2'. FIG. 2(a) thereby depicts seamless unwrapping or unwrap compatibility, i.e., a continually linear relationship between signal and $\phi$ even as $\phi$ varies across $\pi$.

Referring to FIG. 2(b), there are shown branches B1 and B2 for respective corrected phase values provided by applying the Gradwarp process directly to respective phase values of a geometrically distorted phase image. Corrected phase values which are close to $\pi$ will tend to be non-linear with respect to signal. Thus, branches B1 and B2 of FIG. 2(b) do not match proximate to $\pi$, since the upward displacement B2' shown therein does not align with branch B1. Accordingly, the image provided by such corrected values is not unwrap-compatible. If a phase image is not unwrap compatible, significant artifacts can occur therein. Such artifacts are caused by non-linearities in the unwrapped signal intensity as a function of phase.

To provide a phase image which is corrected for gradient non-linearity, and at the same time is unwrap-compatible, the Gradwarp geometric correction process described above is independently applied to the $I_m$ and $Q_m$ quadrature components corresponding to each pixel location, by selected operation of processor 14. Thus, for a given location $(x_0, y_0, z_0)$, the uncorrected or nominal value $I_m(x_0, y_0, z_0)$ is multiplied by a warp factor to displace it to the actual location of the signal to which it corresponds. An interpolation is then performed, using the respective displaced $I_m$ values, to determine a corrected quadrature value of $I_c$ at the location $(x_0, y_0, z_0)$. Usefully, such operation is expressed as $I_c(x_0, y_0, z_0) = GW\{I_m(x_0, y_0, z_0)\}$. Similarly, the Gradwarp technique is applied to $Q_m(x_0, y_0, z_0)$ to compute a corrected value $Q_c$ at pixel location $(x_0, y_0, z_0)$. Such operation is usefully expressed as $Q_c(x_0, y_0, z_0) = GW\{Q_m(x_0, y_0, z_0)\}$.

After respective values of $I_c$ and $Q_c$ have been determined, the distortion corrected phase value $\phi_c(x_0, y_0, z_0)$ can be computed by operating processor 14 according to the following expression:

$$\phi_c = \tan^{-1}[GW\{Q_m\}/GW\{I_m\}] \qquad \text{Equation 2}$$

After computing a set of corrected phase values $\phi_c$, such values may be coupled to device 16 for storage, or to construct and display a phase image, according to requirements.

The technique of Equation 2 thus provides a phase information image which is both unwrap-compatible and corrected for non-linear gradient distortion. However, such image may still be affected by significant artifacts. As stated above, the interpolation step of the Gradwarp process commonly uses a cubic or quartic function. As a result, conditions referred to as over-shoot and ringing can occur at the boundary between tissue and air. This condition is depicted in FIG. 3(a), which shows signal strength versus spatial position along the X-axis. For purposes of illustration, the X-axis passes through the air-tissue boundary. The tissue produces signal, while the air does not. The cubic or quartic function causes the signal to "over-shoot" or "ring" proximate to the boundary, generating signal intensity peaks $P_1$ and $P_2$, respectively, on opposite sides thereof. The signal peaks cause respective dark and light spots along the boundary, as shown by the arrows $A_t$ and $A_a$, respectively, in FIG. 4(a).

It has been found that the artifacts resulting from signal intensity overshoot can be substantially eliminated by multiplying the $I_m$ and $Q_m$ values corresponding to a given pixel location $(x_0, y_0, z_0)$ by an artifact correction factor $M^n$, prior to applying the Gradwarp correction process thereto. Thus, a modified set of corrected phase values $\phi_c'$ may be generated for a phase information image, wherein:

$$\phi_c' = GW[\{Q_m M^n\}/GW\{I_m M^n\}] \qquad \text{Equation 3}$$

For a pixel location having respective quadrature components $I_m$ and $Q_m$, the value of M to be used for Equation 3 is $M = \sqrt{(I_m^2 + Q_m^2)}$. It has been found that a very useful value for the exponent n in Equation 3 is n=−0.5 at all pixel locations, although other values of n may be used as well. A value of n substantially equal to −0.5 has been found to be optimal in conjunction with cubic interpolation. Other forms of interpolation may benefit from different values of n. As shown by FIG. 3(b), the effect of the artifact correction factor $M^n$ is to significantly reduce the MR signal levels between tissue and air during the intermediate step of Gradwarp application. Since the correction factor is applied to both the numerator and denominator of Equation 3, the over-all contrast in the phase image is not disturbed, as shown by FIG. 4(b) of the drawings. It is also shown by FIG. 4(b), that over-shoot and ringing resulting from Gradwarp interpolation in computing respective values $\phi_c'$ produces substantially reduced peaks $P_1'$ and $P_2'$, which are less apparent in a phase information image formed from respective $\phi_c'$ values.

Referring once again to FIG. 1, computation of respective values $\phi_c'$ by processor 14, in accordance with Equation 3, is represented by a block 22.

Obviously, many modifications and variations of the present invention are possible in light of the above teachings. It is therefore to be understood that within the scope of the disclosed concept, the invention may be practiced otherwise than as specifically described.

What is claimed:

1. A method for correcting MR data, acquired for use in forming a phase information image from the effects of an associated imperfectly linear magnetic gradient field, said method comprising the steps of:

reconstructing MR image elements from data acquired in the presence of said imperfectly linear gradient field, each of said image elements comprising first and second quadrature components corresponding to a pixel location in a set of pixel locations;

multiplying the first and second quadrature components corresponding to said pixel locations by artifact correction factors likewise corresponding to said pixel locations to provide first and second quantities;

applying a geometric correction to each of said first and second quantities to provide corrected first and second components respectively corresponding to said pixel locations, said geometric correction having a specified relationship to said gradient non-linearity; and for a given pixel location, applying the arctangent function to the result obtained by dividing the corrected first component corresponding to the given pixel location by the second corrected component corresponding thereto to provide a corrected phase value for use in forming said image.

2. The method of claim 1 wherein:

the artifact correction factor corresponding to a particular pixel location comprises the quantity $M^n$, where M is the square root of the sum of the squares of the first and second quadrature components respectively corresponding to said particular location.

3. The method of claim 2 wherein:

n is on the order of −0.5 for each of said pixel locations.

4. The method of claim 2 wherein:

n is zero for each of said pixel locations.

5. The method of claim 1 wherein said geometric correction step their comprises:

displacing said first and second quadrature components to respective actual locations, relative to said pixel locations; and employing at least some of said displaced components in performing an interpolation to provide said corrected first and second components.

6. The method of claim 3 wherein:

said method is used to correct MR data acquired for use in shimming.

7. The method of claim 3 wherein:

said method is used to correct MR data acquired for use in phase contrast imaging to image flow of blood.

8. The method of claim 3 wherein:

said method is used to correct MR data acquired for use in phase contrast imaging to image flow of cerebral spinal fluid.

9. A method for correcting MR data, acquired for use in forming a phase image from the effects of an associated imperfectly linear magnetic gradient field, said method comprising the steps of:

reconstructing MR image elements from data acquired in the presence of said imperfectly linear gradient field, each of said image elements corresponding to a pixel location in a set of pixel locations and comprising first and second quadrature components;

applying a geometric correction to each of said first and second quadrature components to provide corrected first and second components respectively corresponding to said pixel locations, said geometric correction having a specified relationship to said gradient non-linearity; and for a given pixel location, applying the arctangent function to the result obtained by dividing the corrected first component corresponding to the given pixel location by the second corrected component corresponding thereto to provide a corrected phase value for use in forming said image.

10. The method of claim 9 wherein:

said geometric correction is applied to respective sets of first and second quantities, each of said first quantities comprising one of said first quadrature components multiplied by an artifact correction factor and each of said second quantities comprising one of said second quantities likewise multiplied by an artifact correction factor, each of said artifact correction factors corresponding to one of said pixel locations.

11. The method of claim 10 wherein:

the artifact correction factor corresponding to a particular pixel location comprises the quantity $M^n$, where M is the square root of the sum of the squares of the first and second quadrature components respectively corresponding to said particular location.

12. The method of claim 11 wherein:

n is on the order of −0.5.

* * * * *